US012563891B2

(12) United States Patent
Hwang et al.

(10) Patent No.: US 12,563,891 B2
(45) Date of Patent: Feb. 24, 2026

(54) DISPLAY DEVICE AND METHOD FOR MANUFACTURING THE SAME

(71) Applicant: LG DISPLAY CO., LTD., Seoul (KR)

(72) Inventors: Jungim Hwang, Gimpo-si (KR); Taewoon Ko, Seoul (KR); Hyunjong Noh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 691 days.

(21) Appl. No.: 17/944,409

(22) Filed: Sep. 14, 2022

(65) Prior Publication Data

US 2023/0171995 A1 Jun. 1, 2023

(30) Foreign Application Priority Data

Nov. 29, 2021 (KR) ........................ 10-2021-0167610

(51) Int. Cl.
H10K 50/80 (2023.01)
G02B 5/30 (2006.01)
H10K 71/00 (2023.01)

(52) U.S. Cl.
CPC ......... H10K 50/868 (2023.02); G02B 5/3083 (2013.01); H10K 71/00 (2023.02)

(58) Field of Classification Search
None
See application file for complete search history.

(56) References Cited

U.S. PATENT DOCUMENTS

| | | | |
|---|---|---|---|
| 5,528,400 A | 6/1996 | Arakawa | |
| 5,583,677 A | 12/1996 | Ito et al. | |
| 9,513,422 B2 | 12/2016 | Kim et al. | |
| 9,690,025 B2 | 6/2017 | Qin | |
| 9,995,943 B2 | 6/2018 | Li | |
| 10,310,286 B2 | 6/2019 | Osato | |
| 10,429,550 B2 | 10/2019 | Cho et al. | |
| 10,509,149 B2 | 12/2019 | Ohyama et al. | |
| 10,527,882 B2 | 1/2020 | Hikita et al. | |
| 2011/0019131 A1 | 1/2011 | Oki et al. | |
| 2014/0041296 A1* | 2/2014 | Ichihashi | A01G 7/045 |
| | | | 362/19 |

(Continued)

FOREIGN PATENT DOCUMENTS

| | | |
|---|---|---|
| CN | 103207426 A | 7/2013 |
| CN | 103235447 A | 8/2013 |

(Continued)

OTHER PUBLICATIONS

Chinese Office Action dated Apr. 1, 2024 issued in Patent Application No. 202211301111.7 w/English Translation (21 pages).

(Continued)

*Primary Examiner* — Michael Lebentritt
(74) *Attorney, Agent, or Firm* — Fish & Richardson P.C.

(57) ABSTRACT

A display device includes a substrate, an alignment film positioned on the substrate, a polarizing layer positioned on the alignment film, and an optical compensation film positioned between the substrate and the alignment film, wherein the optical compensation film has a structure with a first optical compensation film having a phase difference value of $\lambda/4$ of a wavelength of transmitted light and a second optical compensation film having a phase difference value of $\lambda/2$ of the wavelength of the transmitted light stacked with each other.

19 Claims, 16 Drawing Sheets

(56)          References Cited

U.S. PATENT DOCUMENTS

| | | |
|---|---|---|
| 2020/0003942 A1 | 1/2020 | Atsumi |
| 2020/0075896 A1 | 3/2020 | Muramatsu et al. |
| 2021/0278581 A1 | 9/2021 | Umemoto et al. |

FOREIGN PATENT DOCUMENTS

| | | | | |
|---|---|---|---|---|
| CN | 103293585 A | 9/2013 | | |
| CN | 107076902 A | 8/2017 | | |
| CN | 107275505 A | 10/2017 | | |
| CN | 107561619 A | 1/2018 | | |
| CN | 108291996 A | 7/2018 | | |
| CN | 109272824 A | * 1/2019 | ........... | G09B 21/004 |
| CN | 109416426 A | 3/2019 | | |
| CN | 110192130 A | 8/2019 | | |
| JP | 2019204086 A | 11/2019 | | |
| KR | 10-2005-0113747 A | 12/2005 | | |
| KR | 2006-0121314 A | 11/2006 | | |
| KR | 10-2020-0096963 A | 8/2020 | | |
| WO | WO-2019015299 A1 | * 1/2019 | ............ | C09K 19/26 |

OTHER PUBLICATIONS

Chinese Office Action dated Aug. 13, 2024 issued in Patent Application No. 202211301111.7 w/English Translation (21 pages).

\* cited by examiner $T_1$ — 110
— 105
— 100a $T_2$ — 117
— 115
— 100b

LIGHT EXPOSURE

DRY

LIGHT EXPOSURE

DRY

DISPLAY DEVICE AND METHOD FOR MANUFACTURING THE SAME

CROSS-REFERENCE TO RELATED APPLICATION

This application claims the priority of Korean Patent Application No. 10-2021-0167610 filed on Nov. 29, 2021, which is hereby incorporated by reference in its entirety.

BACKGROUND

Field of the Disclosure

The present disclosure relates to a display device, and particularly, to a display device including an optical compensation film, and a method for manufacturing the same.

Description of the Background

Display devices are being applied to various electronic devices such as TVs, mobile phones, laptops, and tablets. To this end, research to develop thinner, lighter and lower power consuming display devices, etc. is continuing.

The display device may include a liquid crystal display device (LCD), a plasma display device (PDP), a field emission display device (FED), an electro-wetting display device (EWD) and an organic light-emitting display device (OLED).

Among those, the organic light-emitting display device (OLED) includes a plurality of pixel areas disposed in a display area in which an image is displayed and a plurality of organic light-emitting elements corresponding to the plurality of pixel areas. Because the organic light-emitting element is self-emissive that emits light by itself, the organic light-emitting display device may have faster response speed, greater luminous efficiency, luminance and viewing angle, and excellent contrast ratio and color gamut compared to the liquid crystal display device.

Such an organic light-emitting display device has a problem in that the contrast ratio, which is a ratio of the brightest color and the darkest color that may be simultaneously expressed in the display device, decreases based on an intensity of external light. When the external light is incident on a stacked face made of a metal material in the organic light-emitting display device, as the external light is reflected from the stack face and transmitted to the display area, the contrast ratio may be reduced and a quality of the screen may be deteriorated.

Accordingly, a method for preventing the reduction of the contrast ratio by preventing the reflection of the external light by introducing a polarizing plate on the organic light-emitting display device is being studied. However, even when the polarizing plate is introduced, when directions of the light reflected from the organic light-emitting display device and an absorption axis of the polarizing plate do not match with each other at a viewing angle, which is oblique with respect to a display panel, a light leaking defect occurs or a color inversion phenomenon in which a color other than the one intended to be expressed appears occurs, so that there are problems resulted from viewing angle characteristics, such as deterioration of image quality and deterioration of visibility.

SUMMARY

Accordingly, the present disclosure is directed to a display device including an optical compensation film, and a method for manufacturing the same that substantially obviates one or more of problems due to limitations and disadvantages described above.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

More specifically, the present disclosure is to prevent or minimize a light leakage or color inversion defect by introducing an optical compensation film that orients a direction of light reflected from an organic light-emitting display device adjacent to or coincident with a direction of an absorption axis of a polarizing layer.

The present disclosure is also to realize excellent image quality even at a viewing angle with little change in image quality resulted from a change in the viewing angle.

The present disclosure is also to form optical compensation films having different phase difference values through a continuous manufacturing process.

Further, the present disclosure is to provide a method for manufacturing a display device that may simplify a manufacturing process by forming a structure in which optical compensation films having different optical properties are stacked via a continuous manufacturing process.

The present disclosure is not limited to the above-mentioned. Other features and advantages of the present disclosure that are not mentioned may be understood based on following descriptions, and may be more clearly understood based on aspects of the present disclosure. Further, it will be easily understood that the purposes and advantages of the present disclosure may be realized using means shown in the claims and combinations thereof.

In an aspect of the present disclosure, a display device includes a substrate, an alignment film positioned on the substrate, a polarizing layer positioned on the alignment film, and an optical compensation film positioned between the substrate and the alignment film, and the optical compensation film has a structure with a first optical compensation film having a phase difference value of $\lambda/4$ of a wavelength of transmitted light and a second optical compensation film having a phase difference value of $\lambda/2$ of the wavelength of the transmitted light stacked with each other.

In an aspect of the present disclosure, a display device includes a substrate, a polarizing layer positioned on the substrate, an alignment film positioned beneath the polarizing layer, and an optical compensation film positioned between the substrate and the alignment film, and the optical compensation film includes a first optical compensation film having a phase difference value of $\lambda/2$ of a wavelength of transmitted light and a second optical compensation film having a phase difference value of $\lambda/4$ of the wavelength of the transmitted light.

In a further aspect of the present disclosure, a method for manufacturing a display device includes forming an alignment film optically aligned in a first direction, forming a first optical compensation film on the alignment film, applying a phase difference solution onto the first optical compensation film, irradiating polarized ultraviolet ray onto the phase difference solution to form a second optical compensation film optically aligned in a second direction different from the first direction, disposing an optical compensation film including the alignment film, the first optical compensation film, and the second optical compensation film on a substrate, and forming a polarizing layer on the optical compensation film.

According to the present disclosure, the defect such as the light leakage or the color inversion may be prevented or minimized by introducing the optical compensation film that orients the direction of the light reflected from the organic light-emitting display device adjacent to or coincident with the direction of the absorption axis of the polarizing layer.

Further, even when the external light is incident on the organic light-emitting display device, the external light may be prevented from being reflected outwardly of the display area by the optical compensation film in the organic light-emitting display device.

Further, the excellent image quality may be realized as the accuracy of representing the color to be realized increases also at the viewing angle because the color change resulted from the change in the viewing angle is small.

Further, the manufacturing process may be simplified as the optical compensation films having the different phase difference values and optical properties are formed via the continuous manufacturing process.

Accordingly, the reliability of the display device may be improved by preventing the defect that occurs when the two sheets of optical compensation films are separately manufactured and bonded to each other.

Effects of the present disclosure are not limited to the above-mentioned effects, and other effects as not mentioned will be clearly understood by those skilled in the art from following descriptions.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIG. 3A and FIG. 3B are diagrams illustrating a movement of light on a Poincare sphere when a display device according to the first aspect of the present disclosure is applied;

FIG. 4 is a diagram for illustrating a display device according to a second aspect of the present disclosure;

DETAILED DESCRIPTION

Figure 1A:
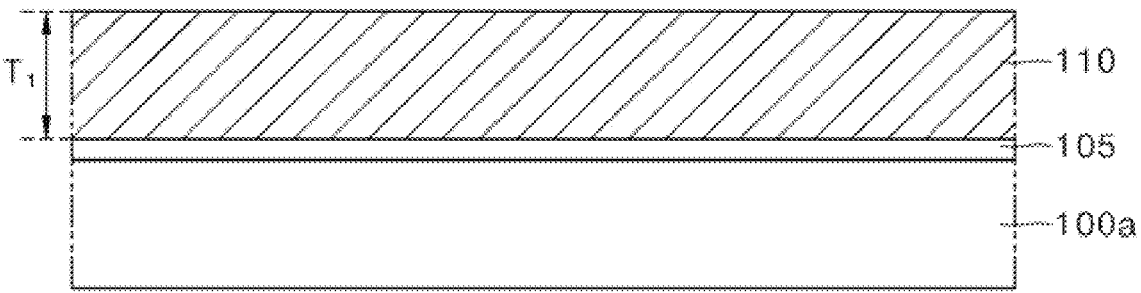
FIG. 1A to FIG. 1E are drawings for illustrating a method for manufacturing a display device according to a first aspect of the present disclosure.

Advantages and features of the present disclosure, and a method of achieving the advantages and features will become apparent with reference to aspects described later in detail together with the accompanying drawings. However, the present disclosure is not limited to the aspects as disclosed below, but may be implemented in various different forms. Thus, these aspects are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the aspects of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular aspects only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various aspects of the present disclosure may be partially or entirely combined with each other, and may be technically associated with each other or operate with each other. The aspects may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various aspects of the present disclosure may be partially or entirely combined with each other, and may be technically associated with each other or operate with each other. The aspects may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to each aspect of the present disclosure will be described with reference to the accompanying drawings.

Figures 3A, 3B, 4:
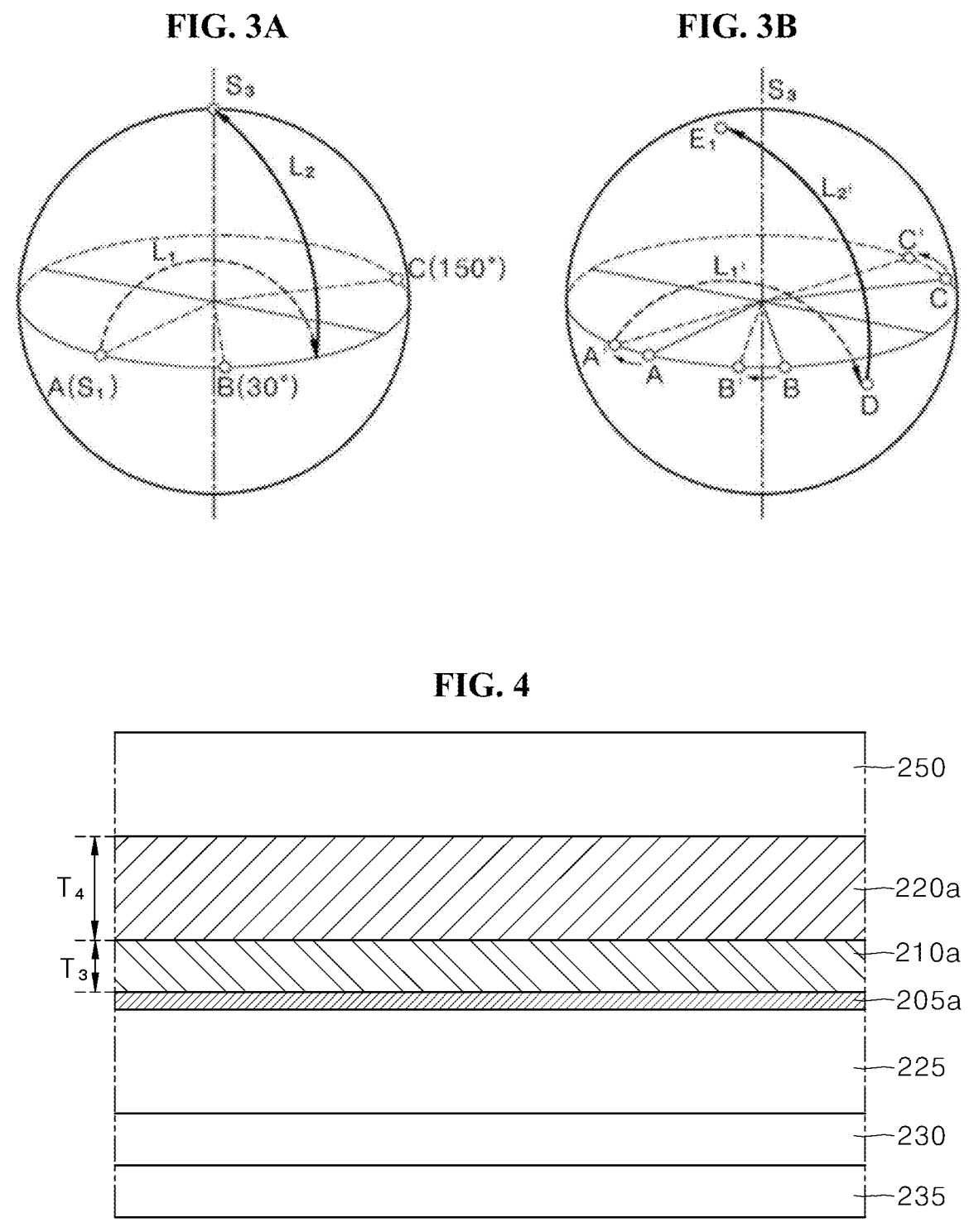

FIG. 1A to FIG. 1E are drawings for illustrating a method for manufacturing a display device according to a first aspect of the present disclosure. FIG. 2 is a schematic exploded perspective view of a display device including an optical compensation film according to the first aspect of the present disclosure. FIG. 3 is a diagram illustrating a movement of light on a Poincare sphere when a display device according to the first aspect of the present disclosure is applied. FIG. 4 is a diagram for illustrating a display device according to a second aspect of the present disclosure.

Figure 2:
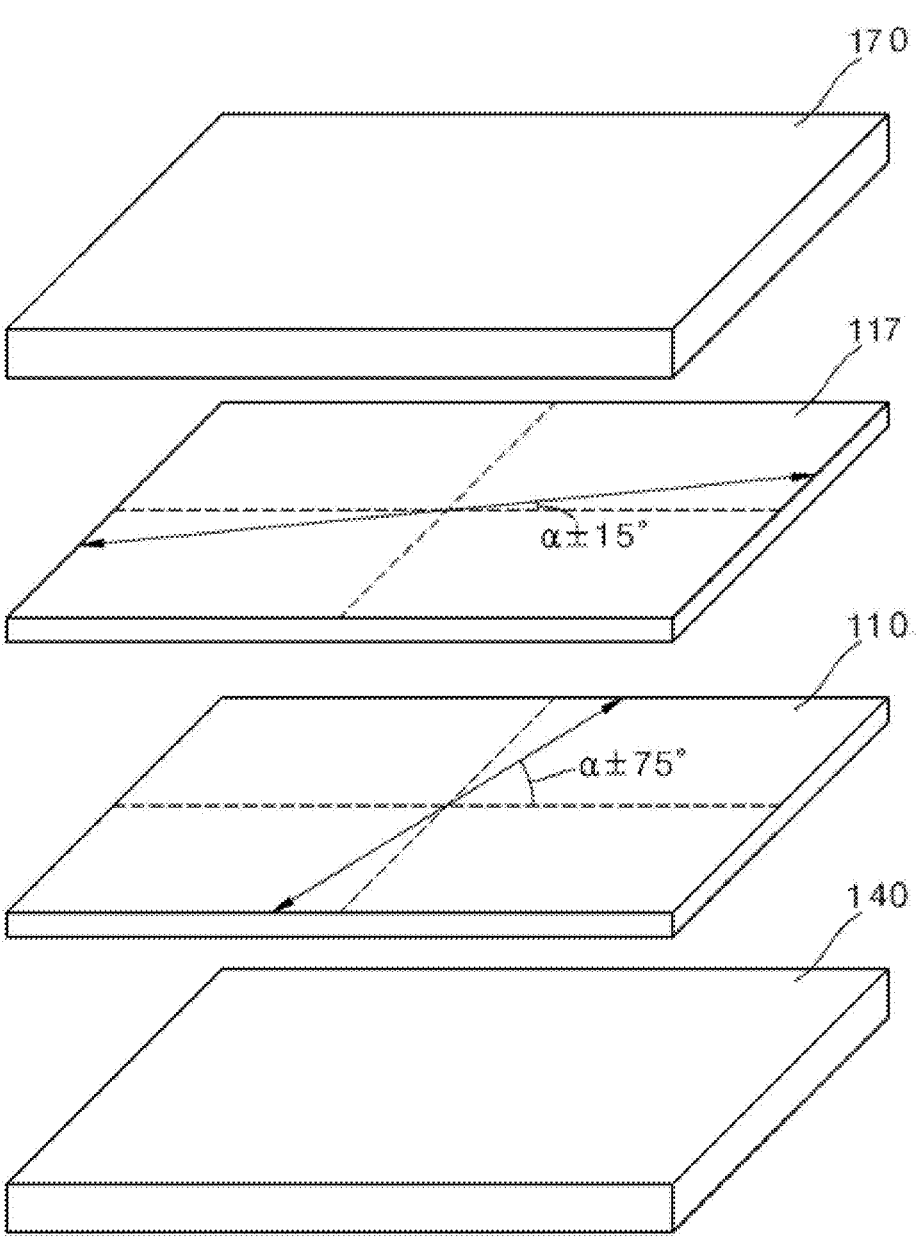
FIG. 2 is a schematic exploded perspective view of a display device including an optical compensation film according to the first aspect of the present disclosure.

Referring to FIG. 1A, a first alignment film 105 and a first optical compensation film 110 are formed on a front face of a first base film 100a. In one example, one of photosensitive polymer-based materials such as polyimide (PI), polystyrene and polyacrylate may be selected and applied as the first alignment film 105. Such photosensitive polymer material is irradiated with light to be formed as the first alignment film 105 whose surface is aligned in a first direction perpendicular or parallel to a surface of the first base film 100a. The first optical compensation film 110 is formed by coating a first reactive mesogenic material on the first alignment film 105 and performing a drying process. In this regard, the first reactive mesogenic material may be formed to have a first thickness T1.

Figure 1B:
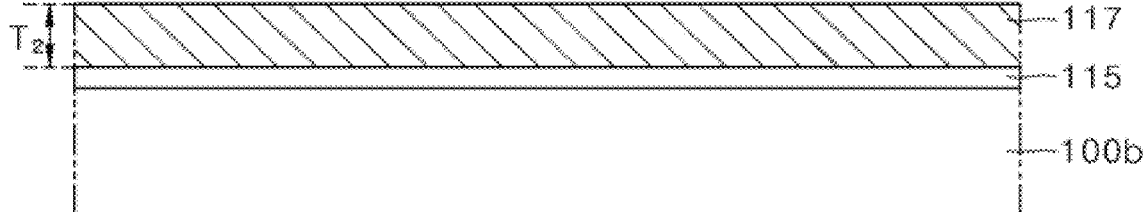

Referring to FIG. 1B, a second alignment film 115 and a second optical compensation film 117 are formed on a front face of a second base film 100b. In one example, one of the photosensitive polymer-based materials, which are the same as those of the first alignment film 115, may be selected and applied as the second alignment film 115. Such photosensitive polymer material is irradiated with light to be formed as the second alignment film 115 whose surface is aligned in a second direction perpendicular or horizontal to a surface of the second base film 100b. When the surface of the first alignment film 105 is aligned in the first direction, the surface of the second alignment film 115 is aligned in the second direction, which is different from the first direction of the first alignment film. For example, when the first direction is a vertical direction, the second direction may be a horizontal direction, and when the first direction is the horizontal direction, the second direction may be the vertical direction.

The second optical compensation film 117 is formed by coating the reactive mesogenic material on the second alignment film 115 and performing the drying process. In this regard, the second optical compensation film 117 may be formed by applying the reactive mesogenic material to have a second thickness T2 relatively smaller than the first thickness of the first optical compensation film 110. Accordingly, the first optical compensation film 110 may be formed as a quarter-wave plate (QWP) having a quarter-wave value ($\lambda/4$), and the second optical compensation film 117 may be formed as a half-wave plate (HWP) having a half-wave value ($\lambda/2$).

Figure 1C:
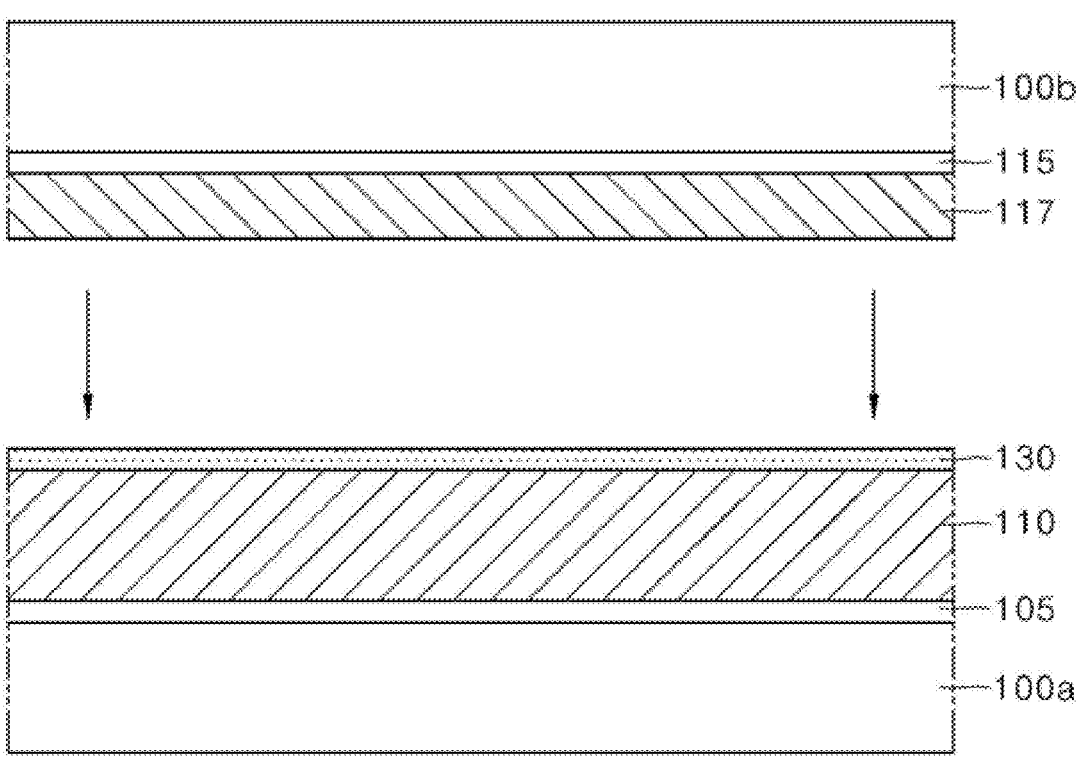

Referring to FIG. 1C, the first optical compensation film 110 and the second optical compensation film 117 are arranged to face each other. Subsequently, an adhesive 130 is applied on an exposed face of the first optical compensation film 110.

Figure 1D:
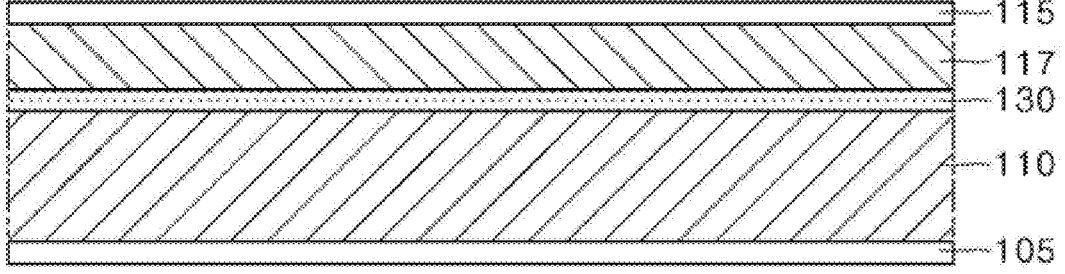

Referring to FIG. 1D, the second base film 100b, on which the second optical compensation film 117 is formed, is moved toward the first optical compensation film 110 to which the adhesive 130 is applied, and adhered to the first optical compensation film 110. In addition, the first base film 100a and the second base film 100b are peeled from the first optical compensation film 110 and the second optical compensation film 117, respectively. Then, a structure in which the first alignment film 105, the first optical compensation film 110, the adhesive 130, the second optical compensation film 117, and the second alignment film 115 are stacked in order from the bottom is formed. In this regard, each of the first alignment film 105 and the second alignment film 115 is located in the outermost portion of the stacked structure.

Figure 1E:
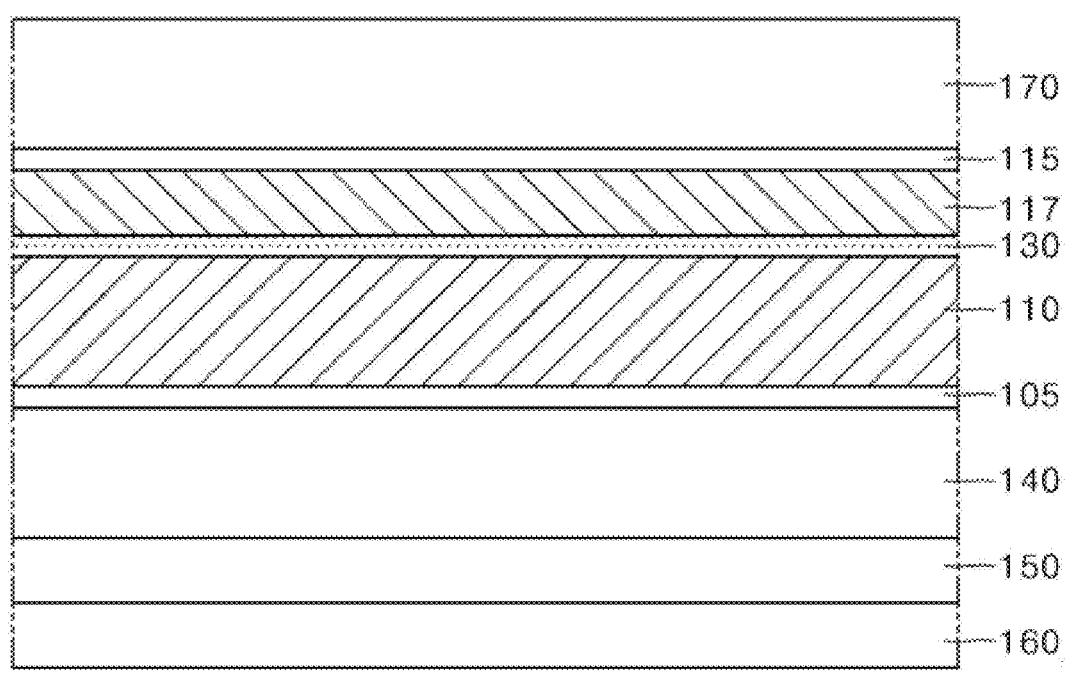

Referring to FIG. 1E, an optical compensation film including the first optical compensation film 110 and the second optical compensation film 117 is disposed on a substrate 140. On one surface (or a bottom side) of the substrate 140, an array 150 in which a circuit including a driving thin-film transistor, a storage capacitor, and the like, and an organic light-emitting element are formed may be disposed, and the array 150 may be sealed by a protective film 160 made of an insulating material.

The optical compensation film including the first optical compensation film 110 and the second optical compensation film 117 may be disposed on the other surface opposite to one surface of the substrate 140 on which the array 150 and the protective film 160 are disposed, for example, on the other surface (or on upper side) of the substrate 140.

In addition, a polarizing layer 170 is disposed on the second optical compensation film 117. The polarizing layer 170 changes polarizing characteristic of the incident light. For example, reflection of the external light may be prevented. In one example, the polarizing layer 170 may contain polyvinyl alcohol (PVA).

The display device formed through the processes in FIG. 1A to FIG. 1E has a structure in which the first optical compensation film 110 and the second optical compensation film 117 are sequentially disposed between the substrate 140 and the polarizing layer 170, as shown in FIG. 2. In this regard, the first optical compensation film 110 is formed as the quarter-wave plate (QWP) having the quarter-wave value λ/4 and the second optical compensation film 117 is formed as the half-wave plate (HWP) having the half-wave value λ/2. In one example, when an angle of a transmission axis of the polarizing layer 170 is 0 degrees, the first optical compensation film 110 has a phase-difference axis of 75 degrees and the second optical compensation film 117 has a phase-difference axis of 15 degrees. Further, each of the first optical compensation film 110 and the second optical compensation film 117 is formed as positive (+) A-plates. A positive A-plate refers to positively birefringent A-plate (i.e. A-plate with a positive Δn (birefringence), which is a difference in refractive index for two polarizations of light).

A light in a black state should first pass through the first optical compensation film 110 from a starting point, then, pass through the second optical compensation film 117 again, and then, be completely absorbed in the polarizing layer 170 so as not to be emitted to the outside in the same manner when viewed from the front and at a viewing angle.

However, when both the first optical compensation film 110 and the second optical compensation film 117 are formed as the positive (+) A-plates, not an entirety of light may be absorbed in the polarizing layer 170 and a portion of light may leak or the light may exhibit an inverted color. Hereinafter, this will be illustrated with reference to the drawings.

When the first optical compensation film 110 and the second optical compensation film 117 are both formed as the positive (+) A-plates, referring to FIG. 3, which shows a movement of the light in the black state on a Poincare sphere, a horizontal plane is formed by a starting point A, a first measuring point C influenced by the angle of the 75-degree phase-difference axis of the first optical compensation film 110, and a second measuring point B influenced by the angle of the 15-degree phase-difference axis of the second optical compensation film 117, and paths L1 and L2 of the light are determined. In this regard, the first measuring point C has a value of 150 degrees, which is twice the 75 degrees of the phase-difference axis of the first optical compensation film 110, and the second measurement point B has a value of 30 degrees, which is twice the 15 degrees of the phase-difference axis of the second optical compensation film 117.

In one example, in FIG. 3A, which shows the movement of the light when viewed from the front of the display panel, light S1 moves from the starting point A along a first optical path L1 for primarily moving to a predefined position on the horizontal plane after passing through the first optical compensation film 110, and along a second optical path L2 for secondarily moving to an absorption axis S3 of the polarizing layer 170 after passing through the second optical compensation film 117, so that a good black state may be obtained.

In this regard, referring to FIG. 3B, which shows the movement of the light when viewed at the viewing angle for viewing the display panel at a predefined angle, due to characteristics of the viewing angle, the starting point A is changed to A', and accordingly, the first measuring point is also changed from C to C', and the second measuring point is also changed from B to B'. The first optical compensation film 110 and the second optical compensation film 117 that provide the phase difference values are disposed to optically compensate for such change. However, as both the first optical compensation film 110 and the second optical compensation film 117 are formed as the positive (+) A-plates, the films are also affected by a refractive index of the light, so that the optical compensation is not completely achieved.

For example, in a path of the light starting from the changed starting point A', the light that has passed through the first optical compensation film 110 is changed in a horizontal plane defined by the changed first measuring point C' and the changed second measuring point B'. Accordingly, when viewed from the front, an intermediate arrival point D is formed at a position outside the horizontal plane, so that the light moves along a first optical path L1' for primarily moving to the intermediate arrival point D and a second optical path L2' for secondarily moving to a point E1 far away from the absorption axis S3 of the polarizing layer 170 by the influence of the refractive index of the light after passing through the second optical compensation film 117.

In other words, even when the first optical compensation film 110 and the second optical compensation film 117 are introduced, as the light is not completely absorbed by the absorption axis S3 of the polarizing layer 150, the light is not able to be blocked, resulting in the light leakage or color inversion defect. Such light leakage and color inversion defect may deteriorate an image quality or visibility, such as distort an image.

Further, as described above, when the first optical compensation film 110 and the second optical compensation film 117 are separately manufactured, in order to integrate the first optical compensation film 110 and the second optical compensation film 117, a separate bonding process using the adhesive 130 must be performed. However, a defect may occur in the course of the bonding process, so that a position at which the light passes through the first optical compensation film 110 or the second optical compensation film 117 may be changed. Further, as an additional process for the bonding process is required, process operations may be complicated and a manufacturing cost may increase.

Accordingly, in other aspects of the present disclosure, a display device and a method for manufacturing the same may prevent the light leakage and the color inversion, and may prevent the process complicated operations while preventing the defect that may occur during the bonding process by performing the separate bonding process when forming the first optical compensation film and the second optical compensation film. Those will be illustrated with reference to drawings below.

Figure 5:
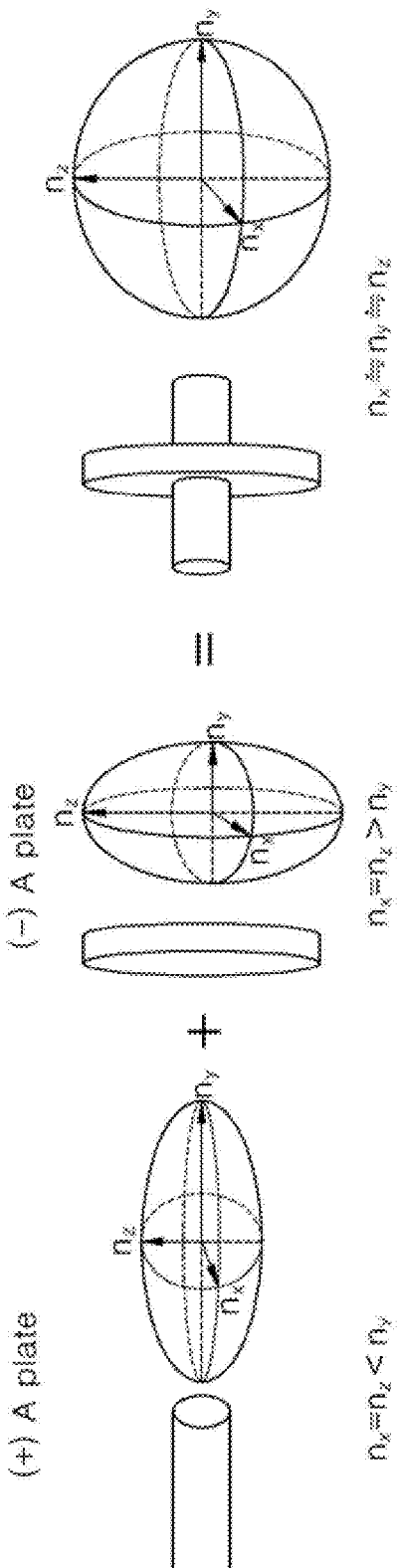
FIG. 5 is a diagram for illustrating optical compensation characteristics when a display device according to the second aspect of the present disclosure is applied.
Figure 5:

FIG. 4 is a diagram for illustrating a display device according to a second aspect of the present disclosure. FIG. 5 is a diagram for illustrating optical compensation characteristics when a display device according to a second aspect is applied. FIG. 6 is a diagram illustrating a movement of light on a Poincare sphere when a display device according to a second aspect is applied. FIG. 7 is a diagram showing dispersion in color coordinates of a display device according to a first aspect and a second aspect.

Referring to FIG. 4, the display device according to the second aspect of the present disclosure includes a substrate 225, an array 230 located on a first face of the substrate 225, and an alignment film 205a, a first optical compensation film 210a, a second optical compensation film 220a, and a polarizing layer 250 formed sequentially on a second face opposite to the first face of the substrate 225.

The substrate 225 may include a display substrate made of a polymer or plastic such as polyimide (PI), or glass. The array 230 positioned on the first face of the substrate 225 includes a circuit including a driving thin-film transistor, a storage capacitor, and the like, and a plurality of pixels formed with an organic light-emitting element. The pixel is composed of a conductive layer and an organic material layer for emitting light of various colors to the outside. For example, the pixel may include the organic light-emitting element composed of a pixel electrode, an organic light-emitting layer, and a common electrode. The light may be emitted from the organic light-emitting element. The array 230 may be sealed by the protective film 235. A protective film 235 may be composed of an inorganic insulating layer or an organic insulating layer, or may have a multi-layer structure thereof.

The alignment film 205a, the first optical compensation film 210a, the second optical compensation film 220a, and the polarizing layer 250 are sequentially stacked on the second face opposite to the first face of the substrate 225 on which the array 230 is disposed.

The alignment film 205a is made of the photosensitive polymer-based material selected from the group consisting of the polyimide (PI), the polystyrene, and the polyacrylate. The alignment film 205a is in a state of being optically aligned in the first direction perpendicular or horizontal to a plane direction of the substrate 225.

The polarizing layer 250 is disposed on the second optical compensation film 220a, and changes polarization characteristics of the incident light. In one example, the polarizing layer 250 may contain the polyvinyl alcohol.

One surface of the first optical compensation film 210a is positioned in contact with one surface of the alignment film 205a. The first optical compensation film 210a is made of the reactive mesogenic (RM) material. The first optical compensation film 210a may be formed as the quarter-wave plate (QWP). The quarter-wave plate (QWP) converts a state of light from a circularly polarized state to a linearly polarized state, and converts the state of light from the linearly polarized state to the circularly polarized state and transmits the light. The QWP has a phase difference value of $\lambda/4$ of $\frac{1}{4}$ of a wavelength $\lambda$ of the transmitted light. For example, when the wavelength $\lambda$ of the transmitted light is 550 nm, the first optical compensation film 210a has a phase difference value in a range from 110 nm to 130 nm.

The second optical compensation film 220a is positioned in contact with the other surface of the first optical compensation film 210a. The second optical compensation film 220a contains a polymer material, such as azobenzene, that causes a cis-trans isomerization reaction. The second optical compensation film 220a is optically aligned in the second direction different from the first direction in which the first optical compensation film 210a is optically aligned by the alignment film 205a. For example, when the alignment film 205a is optically aligned in the vertical direction, the second optical compensation film 220a may be optically aligned in the horizontal direction, and when the alignment film 205a is optically aligned in the horizontal direction, the second optical compensation film 220a may be induced to be optically aligned in the vertical direction.

The second optical compensation film 220a may be formed as the half-wave plate (HWP). The half-wave plate (HWP) converts the state of light from the circularly polarized state to the linearly polarized state, and converts the state of light from the linearly polarized state to the circularly polarized state and transmits the light. The HWP has a phase difference value $\lambda/2$ of $\frac{1}{2}$ of the wavelength $\lambda$ of the transmitted light. For example, when the wavelength $\lambda$ of the transmitted light is 550 nm, the second optical compensation film 220a has a phase difference value in a range from 220 nm to 260 nm.

As each of the first optical compensation film 210a and the second optical compensation film 220a has the phase difference value varying depending on the thickness, a second thickness T4 of the second optical compensation film 220a is a relatively greater than a first thickness T3 of the first optical compensation film 210a. Further, the first optical compensation film 210a is formed as the positive (+) A-plate and the second optical compensation film 220a is formed as the negative (−) A-plate.

Specifically, referring to FIG. 5, it may be understood that the positive (+) A-plate is a case in which a direction of one axis with a different size among three axes (nx, ny, and nz) of the plate is perpendicular to a light propagation direction and the size of said one axis is greater than the size of the other two axes. When light travels in a z-axis and said one axis with the different size is a y-axis, in the positive (+) A-plate, nx=nz<ny, and the positive (+) A-plate has a rod-like shape, and nematic and cholesteric liquid crystal phases are used.

It may be understood that the negative (−) A-plate is a case in which the direction of said one axis with the different size among the three axes (nx, ny, and nz) of the plate is perpendicular to the light propagation direction and the size of said one axis is smaller than the size of the other two axes. When light travels in the z-axis and said one axis with the different size is the y-axis, in the negative (−) A-plate, nx=nz>ny, and the negative (−) A-plate has a discotic-like shape.

In addition, when the positive (+) A-plate and the negative (−) A-plate are placed together, refractive indices of the light are canceled and nx≈ny≈nz as shown in FIG. 5, so that the refractive indices of the light have almost the same value.

In other words, when the first optical compensation film 210a and the second optical compensation film 220a are respectively formed as the positive (+) A-plate and the negative (−) A-plate while being sequentially stacked and disposed, the refractive indices of the light are cancelled, so that the refractive indices of the light passing through both of the optical compensation films 210a and 220a may have almost the same value. As the refractive indices of the light have almost the same value, the influence of the refractive index may be minimized while providing the optical compensation in the movement of the light, so that the occurrence of the light leakage or color inversion defect may be prevented or minimized.

Specifically, with reference to FIG. 6, a horizontal plane is formed by the starting point A, the first measuring point C influenced by the angle of the 75-degree phase-difference axis of the first optical compensation film 210a, and the second measuring point B influenced by the angle of the 15-degree phase-difference axis of the second optical compensation film 220a, and paths L3 and L4 of the light are determined. In this regard, the first measuring point C has the value of 150 degrees, which is twice the 75 degrees of the phase-difference axis of the first optical compensation film 210a, and the second measurement point B has the value of 30 degrees, which is twice the 15 degrees of the phase-difference axis of the second optical compensation film 220a.

Figure 6A:
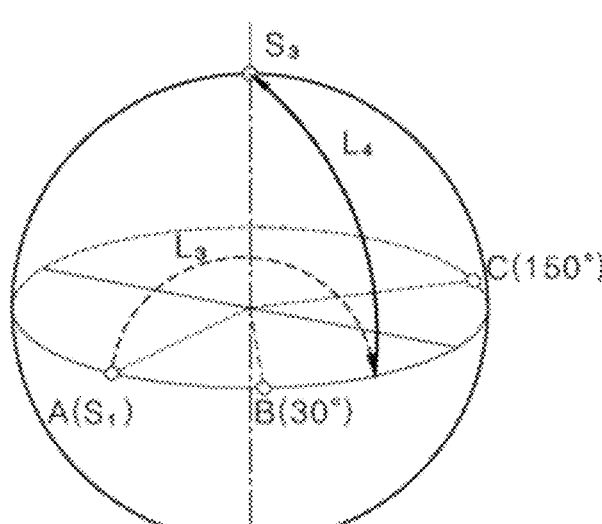
FIG. 6A and FIG. 6B are diagrams illustrating a movement of light on a Poincare sphere when a display device according to the second aspect of the present disclosure is applied.
Figure 7:
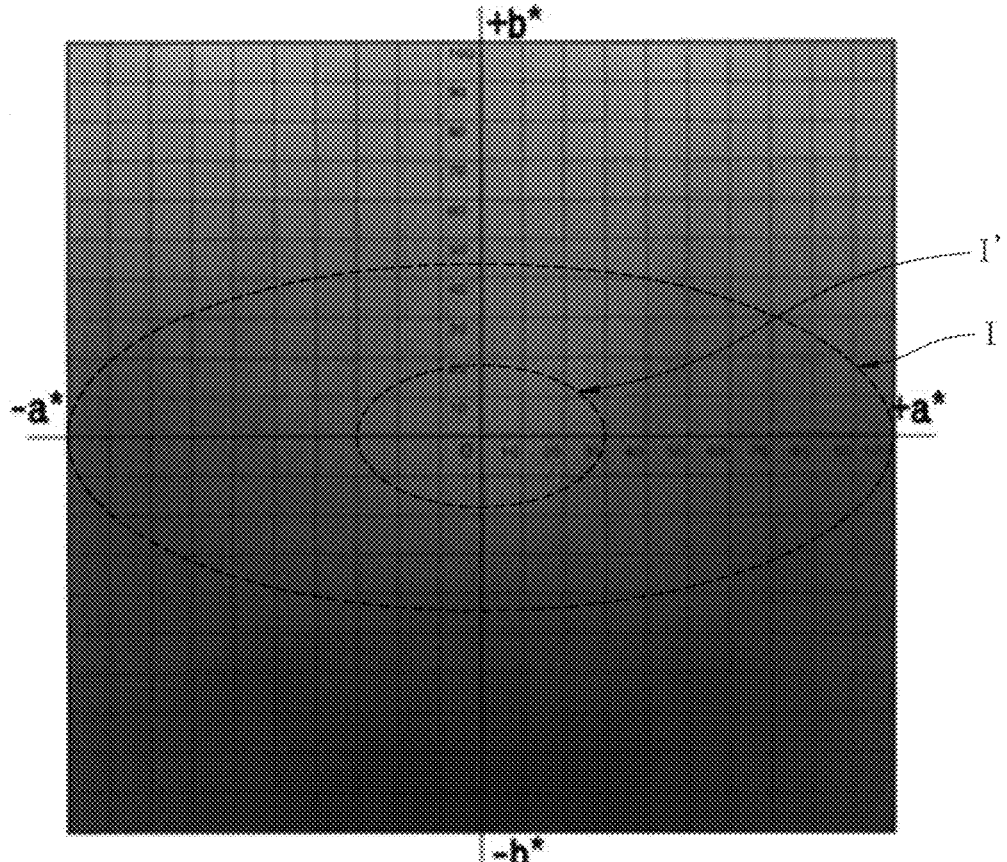
FIG. 7 is a diagram showing dispersion in color coordinates of a display device according to the first and second aspects of the present disclosure.

With reference to FIG. 6A, which shows the movement of the light when viewed from the front of the display panel, as the paths L3 and L4 of the light are respectively set such that the light S1 moves from the starting point A to primarily move to the horizontal plane defined by the first measuring point C and the second measuring point B after passing through the first optical compensation film 210a, and to pass through the second optical compensation film 220a and move toward the absorption axis S3 of the polarizing layer 250, the good black state may be obtained.

Figure 6B:
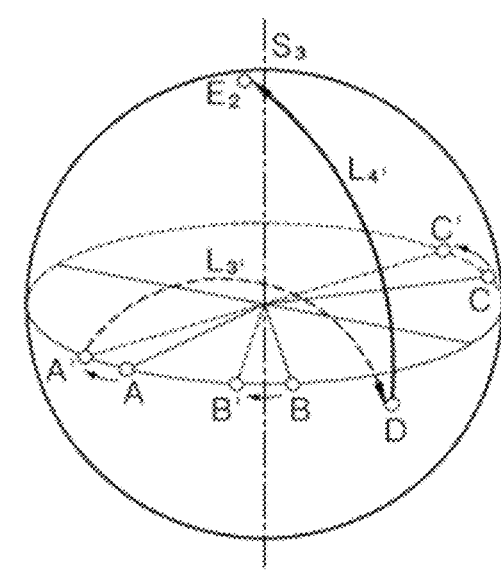

Further, referring to FIG. 6B, which shows the movement of the light when viewed at the viewing angle for viewing the display panel at the predefined angle, the starting point A is changed to A', and accordingly, the first measuring point C and the second measuring point B are also changed to C' and B', respectively. Then, the light started from the starting point A' is changed in a horizontal plane by the changed first measuring point C' and the changed second measuring point B'. Accordingly, when viewed from the front, the intermediate arrival point D is formed at the position outside the formed horizontal plane, so that the light moves along a first optical path L3' for primarily moving to the intermediate arrival point D and a second optical path L4' for secondarily moving to a point E2 adjacent to the absorption axis S3 without the influence of the refractive index of the light after passing through the second optical compensation film 220a.

In this regard, as the refractive indices of the light have almost the same value by forming the first optical compensation film 210a and the second optical compensation film 220a as the positive (+) A-plate and the negative (−) A-plate, respectively, the optical compensation is made while not being affected by the refractive index in the movement of the light, so that the paths L3' and L4' of the light may be made to the point E2 adjacent to the absorption axis S3 at the viewing angle. Accordingly, the light may move to the point E2 adjacent to the absorption axis S3, thereby preventing or minimizing the occurrence of the light leakage phenomenon or the color inversion defect.

Further, as the first optical compensation film 210a and the second optical compensation film 220a are formed as the positive (+) A-plate and the negative (−) A-plate, respectively, reflectance of when viewed from the front may be reduced and color change characteristics may be improved at all azimuth angles.

TABLE 1

| | Y(%) | Δa* | Δb* |
|---|---|---|---|
| Comparative Example | 6.6468 | 4.136 | 3.655 |
| Example 1 | 6.098 | 2.922 | 1.44 |
| Δ | 0.37 | 1.214 | 2.215 |

Y: reflectance at the front
Δa*: max a* − min a*
Δb*: max b* − min b*

[Table 1] is a table showing measured optical properties in Example 1 having the structure of FIG. 4 and Comparative Example having the structure of FIG. 1E. Referring to the reflectance Y at the front, it may be seen that the reflectance decreases as Comparative Example has a reflectance of 6.6468%, whereas Example 1 shows a reflectance of 6.098%, which is 0.37% smaller than the reflectance of Comparative Example.

Next, the color change characteristics were compared between Example 1 having the structure of FIG. 4 and Comparative Example having the structure of FIG. 1E. It may be seen that the color change of the organic light-emitting display device is greater when being measured continuously along all of the azimuth angles from 0 degrees to 360 degrees in a state in which a polar angle is fixed than when being measured in a method of fixing the azimuth angle (Θ) and changing the polar angle (θ). Accordingly, each color change characteristic was measured while changing the azimuth angle from 0 degrees to 360 degrees at the polar angle fixed at 50 degrees to evaluate the color change characteristics.

In this regard, measured values used to measure the color change characteristic are a*b* values of ab color coordinates designated in 1976 by the International Commission on Illumination (CIE), as shown in FIG. 7. Referring back to [Table 1], in each of Example 1 with the structure of FIG. 4 and Comparative Example with the structure of FIG. 1E, a maximum a* value, a maximum b* value, a minimum a* value, and a minimum b* value were obtained and then Δa* and Δb* values, which are differences thereof, were calculated. In this regard, it may be understood that the smaller the Δ value, the smaller the amount of color change at all of the azimuth angles, that is, the smaller the dispersion in the ab color coordinates. In other words, as the color change characteristics are excellent, an accuracy of representing the color to be realized increases also at the viewing angle. Accordingly, excellent image quality may be realized.

Referring to [Table 1], the Δa* value and the Δb* value in Comparative Example are respectively 4.136 and 3.655, whereas the Δa* value and the Δb* value in Example 1 are respectively 2.922 and 1.44. Thus, it may be seen that the Δa* value decreases by 1.214 in Example 1 than in the Comparative Example, and the Δb* value decreases by 2.215 in Example 1 than in the Comparative Example. In addition, referring to FIG. 7, it may be seen that dispersion I' of Example 1 has a smaller range than dispersion I of Comparative Example. That is, as the first optical compensation film 210a and the second optical compensation film 220a are formed as the positive (+) A-plate and the negative (−) A-plate, respectively, rather than both are formed as the positive (+) A-plates, the accuracy of representing the color to be realized at the viewing angle may be improved while reducing the reflectance at the front.

Hereinafter, with reference to drawings, a method for manufacturing the display device in FIG. 4 will be illustrated.

FIG. 8A to FIG. 8G are drawings for illustrating a method for manufacturing a display device according to a second aspect. In addition, FIG. 9 is a diagram for illustrating an isomerization process of a polymer material.

Figure 8A:
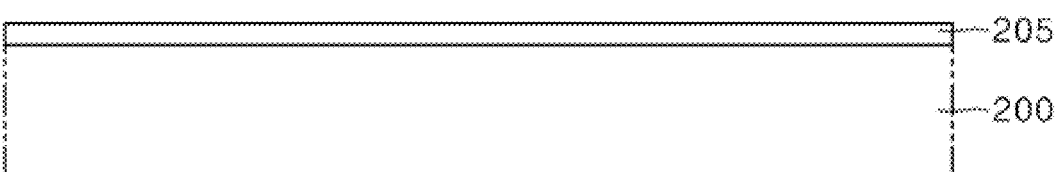
FIG. 8A to FIG. 8G are drawings for illustrating a method for manufacturing a display device according to the second aspect of the present disclosure.
Figure 9:
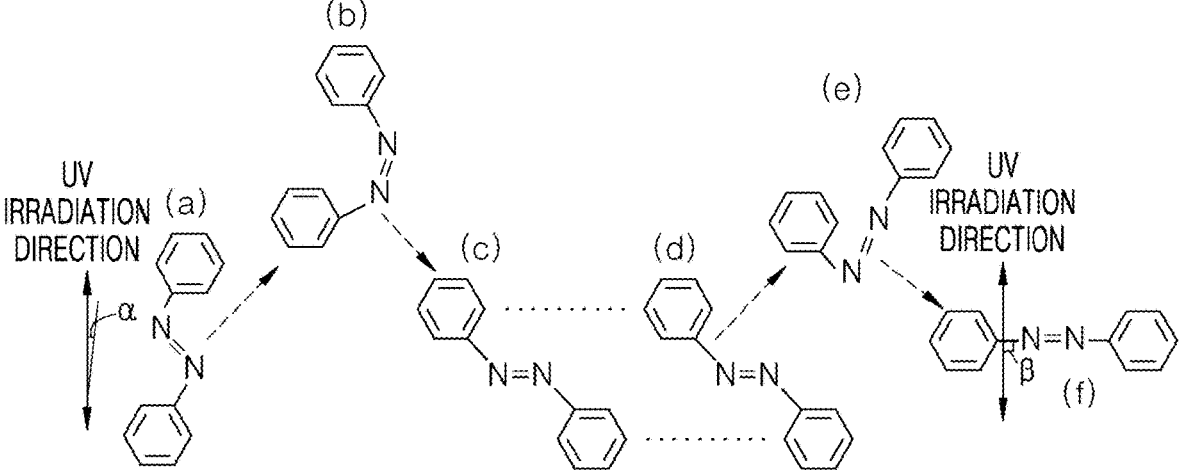
FIG. 9 is a diagram for illustrating an isomerization process of a polymer material.

Referring to FIG. 8A, an alignment material 205 is applied to a front face of a base film 200. The base film 200 is made of a material that may be easily peeled off later. The alignment material 205 may be formed by applying a photosensitive material having a characteristic in which side-chains are aligned in one direction in response to the light. For example, the alignment material 205 may be one selected from the group consisting of the photosensitive polymer-based materials such as the polyimide (PI), the polystyrene, and the polyacrylate.

Figure 8B:
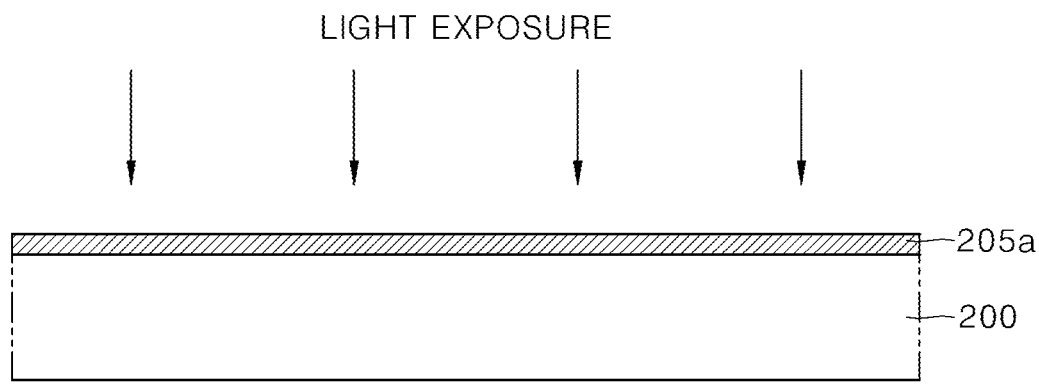

Referring to FIG. 8B, a light exposure process is performed on the alignment material 205 to form the alignment film 205*a*. The alignment material 205 contains a plurality of disordered side-chains. The light exposure process of irradiating the light onto such alignment material 205 is performed to form the alignment film 205*a* in a state of being optically aligned in the first direction. When the light is irradiated onto the alignment material 205, the plurality of disordered side-chains are aligned in one direction, that is, the first direction, in response to the light, to achieve the optically aligned state. In this regard, the first direction may be a direction perpendicular or parallel to a surface of the base film 200. Further, the first direction may be a direction perpendicular or horizontal to a surface of a substrate onto which the alignment film 205*a* will be disposed later.

Figure 8C:
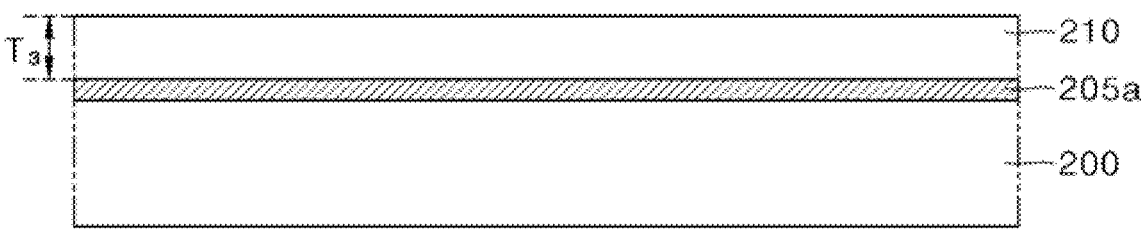

Referring to FIG. 8C, a reactive mesogenic solution 210 is applied onto the alignment film 205*a*. The reactive mesogenic solution 210 may be applied to have the first thickness T3. The reactive mesogenic solution 210 may be applied via coating equipment by dissolving the reactive mesogenic (RM) material in the organic solvent.

The reactive mesogenic (RM) material is a material having a functional group that responds to the light or heat at an end thereof. When a UV ray or the heat is irradiated onto the reactive mesogenic material, an optically anisotropic stationary phase is formed via photopolymerization.

Figure 8D:
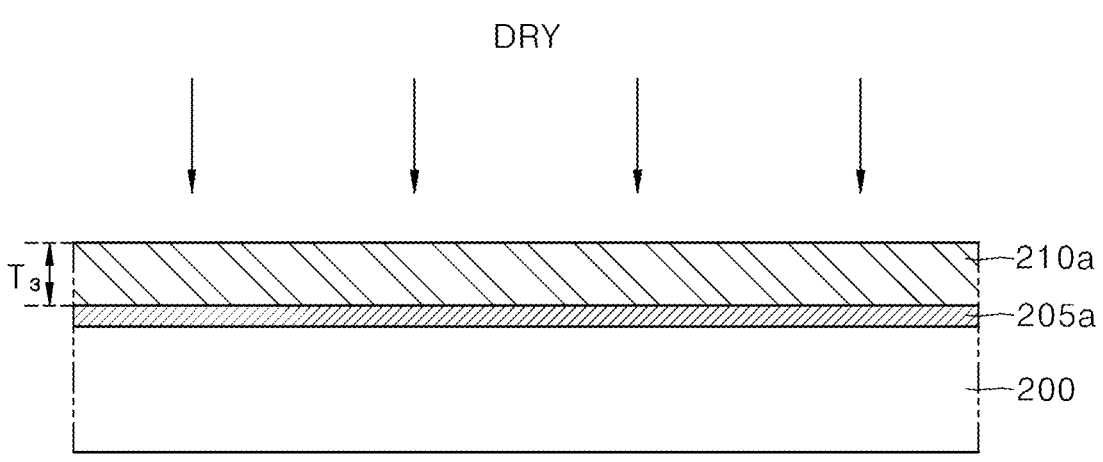

Next, as shown in FIG. 8D, a drying process is performed on the reactive mesogenic solution 210 to form the first optical compensation film 210*a*. The drying process evaporates the organic solvent in the reactive mesogenic solution 210 to form a reactive mesogenic layer on the alignment film 205*a* optically aligned in the first direction. The first optical compensation film 210*a* composed of the reactive mesogenic layer is formed on the alignment film 205*a* via such drying process. The first optical compensation film 210*a* may be formed as the quarter-wave plate (QWP). The quarter-wave plate (QWP) converts the state of light from the circularly polarized state to the linearly polarized state, and converts the state of light from the linearly polarized state to the circularly polarized state and transmits the light. The QWP has the phase difference value $\lambda/4$ of ¼ of the wavelength $\lambda$ of the transmitted light. For example, when the wavelength $\lambda$ of the transmitted light is 550 nm, the first optical compensation film 210*a* has the phase difference value in the range from 110 nm to 130 nm.

Figure 8E:
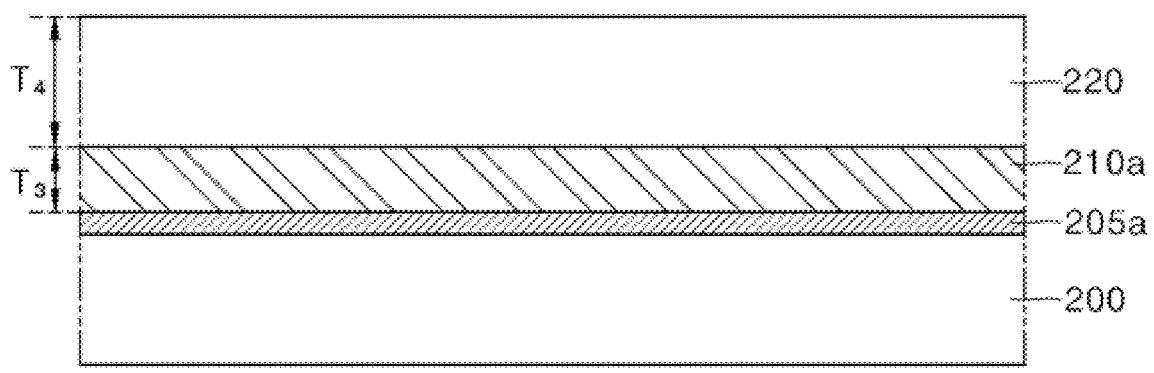

Referring to FIG. 8E, a phase difference solution 220 is applied onto the first optical compensation film 210*a*. The phase difference solution 220 may be applied to have the second thickness T4. In this regard, the phase difference solution 220 may be applied to have the second thickness T4 relatively greater than the first thickness T3 of the first optical compensation film 210*a*. The phase difference solution 220 may be applied via the coating equipment by dissolving the polymer material in the organic solvent. In one example, the phase difference solution 220 may contain the polymer material that causes the cis-trans isomerization reaction like the azobenzene.

Subsequently, a prebake process is performed on the phase difference solution 220 to evaporate the organic solvent in the phase difference solution 220.

Figure 8F:
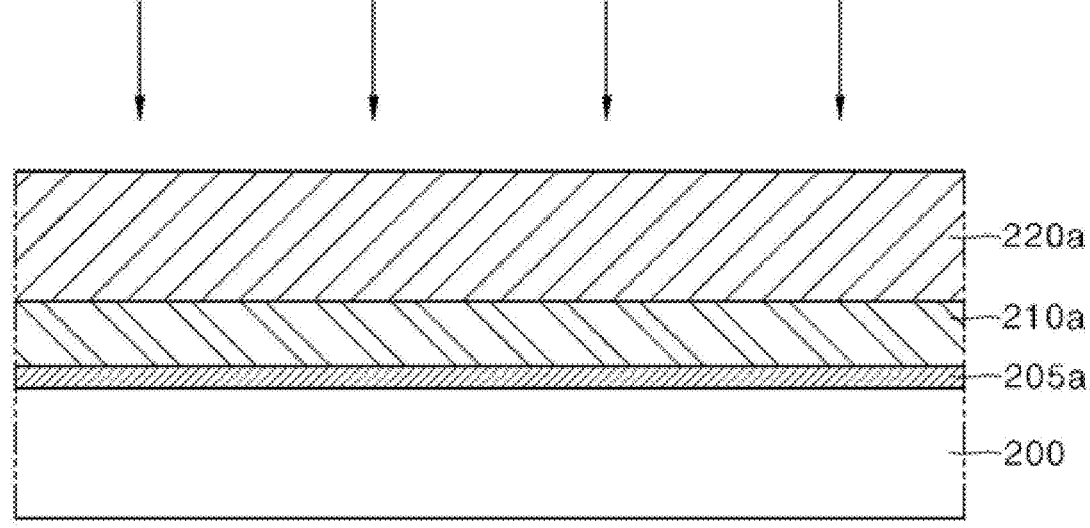

Next, as shown in FIG. 8F, the light exposure process and the drying process are performed on the phase difference solution 220 in which the organic solvent is evaporated to form the second optical compensation film 220*a* optically aligned in the second direction. In this regard, the second direction may be a direction perpendicular or parallel to the surface of the base film 200, and may be a direction different from the first direction of the alignment film 205*a*. For example, when the alignment film 205*a* is optically aligned in the vertical direction, the second optical compensation film 220*a* may be optically aligned in the horizontal direction, and when the alignment film 205*a* is optically aligned in the horizontal direction, the second optical compensation film 220*a* is optically aligned in the vertical direction. Further, the second direction may be a direction perpendicular or parallel to the surface of the substrate onto which the second optical compensation film 220*a* will be disposed later.

The light exposure process irradiates the polarized ultraviolet ray. During the light exposure process, the ultraviolet ray may be irradiated at a polarized angle of 10 to 20 degrees with respect to an absorption axis of a polarizing layer to be formed later with a wavelength in a range from 200 nm to 400 nm. The ultraviolet ray has an angle of 60 degrees with respect to an optical axis of the first optical compensation film 210*a*.

The light exposure process may proceed by irradiating the polarized ultraviolet ray onto the phase difference solution 220. When the polymer material causing the cis-trans isomerization reaction is irradiated with the light such as the ultraviolet ray, as one isomer is changed to another isomer, the optical alignment occurs. For example, referring to FIG. 9, when the polarized ultraviolet ray is irradiated onto the polymer material including the azobenzene, an isomerization phenomenon in which a molecule aligned in a first direction (a) having a predefined angle $\alpha$ with a direction of the irradiated ultraviolet ray rotates to a second direction (b) and a third direction (c) in one cycle occurs. In addition, when such cycle is repeated and the molecule rotates to a fourth direction (d), to a fifth direction (e), and to a sixth direction (f) for n cycles, the isomerization phenomenon ends in a state in which the molecule is rotated to an angle $\beta$ of 90 degrees with respect to the direction of the irradiated ultraviolet ray.

When the azobenzenes are aligned in an angular direction of 90 degrees with respect to the irradiation direction of the ultraviolet ray, the refractive index is also induced to have an angle of 90 degrees with respect to the ultraviolet ray irradiation direction, so that refractive index anisotropy, which causes the optical alignment in the second direction, occurs.

Subsequently, the drying process is performed on the phase difference solution 220 on which the light exposure process has been performed to form the second optical compensation film 220a. The drying process may be performed by seating the base film 200 on which the phase difference solution 220 is formed on a drying apparatus such as a hot plate and heating the base film 200. The second optical compensation film 220a may be formed by fixing the alignment in which the refractive index anisotropy is generated via the drying process.

The second optical compensation film 220a may be formed as the half-wave plate (HWP). The half-wave plate (HWP) converts the state of light from the circularly polarized state to the linearly polarized state, and converts the state of light from the linearly polarized state to the circularly polarized state and transmits the light. The HWP has the phase difference value $\lambda/2$ of $\frac{1}{2}$ of the wavelength $\lambda$ of the transmitted light. For example, when the wavelength $\lambda$ of the transmitted light is 550 nm, the second optical compensation film 220a has the phase difference value in the range from 220 nm to 260 nm.

Each of the first optical compensation film 210a and the second optical compensation film 220a has the phase difference value varying depending on the refractive index and the thickness thereof. As the first optical compensation film 210a according to an aspect of the present disclosure is formed as the quarter-wave plate (QWP) and the second optical compensation film 220a is formed as the half-wave plate (HWP), the second thickness T4 of the second optical compensation film 220a is relatively greater than the first thickness T3 of the first optical compensation film 210a.

Figure 8G:
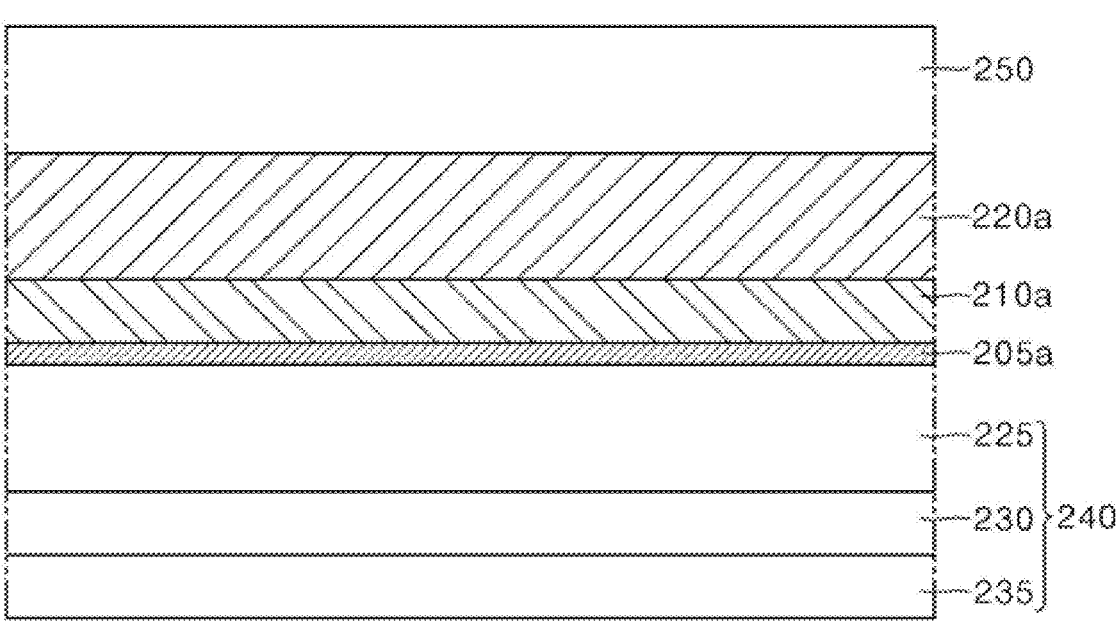

Referring to FIG. 8G, the optical compensation film including the first optical compensation film 210a and the second optical compensation film 220a is disposed on an array substrate 240. The array substrate 240 may include the substrate 225 and the array 230 and the protective film 235 disposed on one surface (or a bottom side) of the substrate 225. The substrate 225 may include the display substrate made of the polymer or the plastic, such as the polyimide (PI), or the glass.

The array 230 may include the circuit including the driving thin-film transistor, the storage capacitor, and the like, and the plurality of pixels formed with the organic light-emitting element. The pixel is composed of the conductive layer and the organic material layer for emitting the light of the various colors to the outside. For example, the pixel may include the organic light-emitting element composed of the pixel electrode, the organic light-emitting layer, and the common electrode. The light may be emitted from the organic light-emitting element.

The array 230 may be sealed by the protective film 160 made of the insulating material. The protective film 235 may be composed of the inorganic insulating layer or the organic insulating layer, or may have the multi-layer structure thereof to prevent external moisture, oxygen, or impurities from penetrating into the organic light-emitting diode and degrading a performance thereof.

The structure in which the alignment film 205a, the first optical compensation film 210a, and the second optical compensation film 220a are stacked may be disposed on the other surface opposite to one face of the substrate 225 on which the array 230 and the protective film 235 are disposed, for example, the upper side of the substrate 225. To this end, the base film 200 is peeled from the alignment film 205a and the alignment film 205a is bonded to the other surface (or the upper side) of the substrate 225.

In addition, the polarizing layer 250 is formed on the second optical compensation film 220a. The polarizing layer 250 changes the polarizing characteristics of the incident light. In one example, the polarizing layer 250 may contain the polyvinyl alcohol (PVA).

As described above, when manufacturing the first optical compensation film and the second optical compensation film, instead of separately manufacturing two optical compensation films and bonding the two films with each other, the two films are formed via the continuous manufacturing process, so that there is an effect of preventing the defect that occurs in the bonding process while simplifying the process of manufacturing the optical compensation film.

In one example, the order in which the first optical compensation film formed as the quarter-wave plate and the second optical compensation film formed as the half-wave plate are stacked on the substrate may be changed. It will be illustrated with reference to drawings below.

Figure 10:
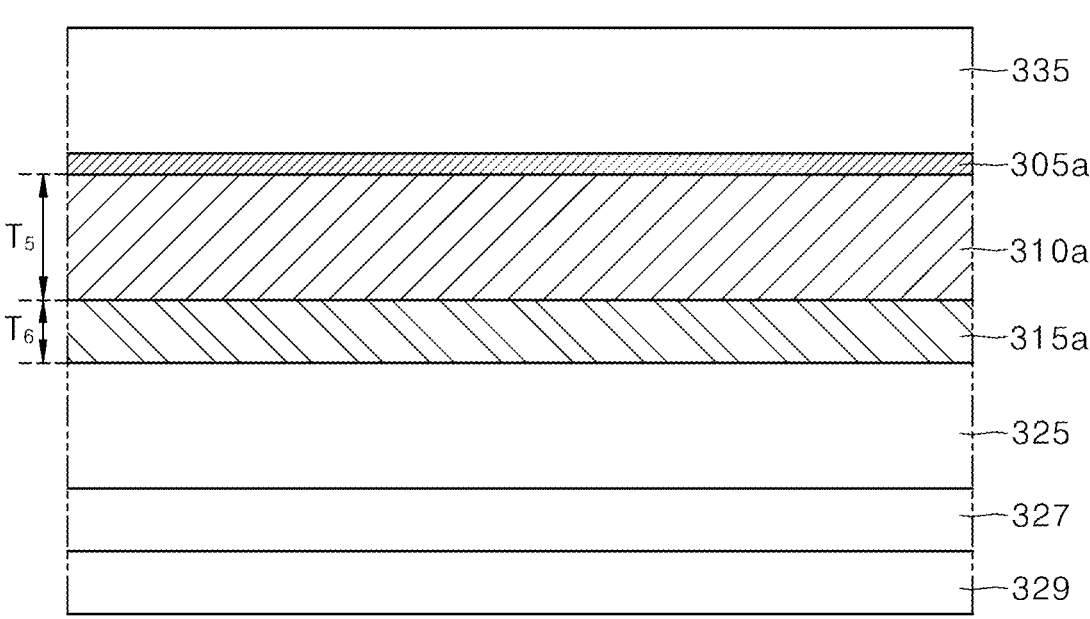
FIG. 10 is a diagram for illustrating a display device according to a third aspect of the present disclosure.

FIG. 10 is a diagram for illustrating a display device according to a third aspect of the present disclosure.

Referring to FIG. 10, the display device includes a substrate 325, an array 327 located on a first face of substrate 325, and a second optical compensation film 315a, a first optical compensation film 310a, an alignment film 305a, and a polarizing layer 335 sequentially formed on a second face opposite to the first face of the substrate 325.

The array 327 positioned on the first face of the substrate 325 includes a circuit including a driving thin-film transistor, a storage capacitor, and the like, and a plurality of pixels formed with an organic light-emitting element. The pixel is composed of a conductive layer and an organic material layer for emitting light of various colors to the outside. For example, the pixel may include an organic light-emitting element composed of a pixel electrode, an organic light-emitting layer, and a common electrode. The light may be emitted from the organic light-emitting element. The array may be sealed by a protective film 329 containing an insulating material.

On the second face opposite to the first face of the substrate 325 on which the array 327 is disposed, the second optical compensation film 315a, the first optical compensation film 310a, the alignment film 305, and the polarizing layer 335 are sequentially stacked.

The second optical compensation film 315a is positioned in contact with the second face of the substrate. The second optical compensation film 315a contains the polymer material, such as the azobenzene, that causes the cis-trans isomerization reaction. The second optical compensation film 315a may be formed as the quarter-wave plate (QWP). The quarter-wave plate (QWP) has the phase difference value $\lambda/4$ of $\frac{1}{4}$ of the wavelength $\lambda$ of the transmitted light. For example, when the wavelength $\lambda$ of the transmitted light is 550 nm, the second optical compensation film has the phase difference value in the range from 110 nm to 130 nm.

The alignment film 305a is made of the material selected from a group consisting of the photosensitive polymer-based materials such as the polyimide (PI), the polystyrene, and the polyacrylate. The alignment film 305a is in the state of being optically aligned in the first direction perpendicular or parallel to the plane direction of the substrate.

One surface of the first optical compensation film 310a is in contact with a surface of the alignment film 305a and the other face thereof opposite to said one surface is positioned in contact with a surface of the second optical compensation film 315a. The first optical compensation film 310a is made of the reactive mesogenic (RM) material. The first optical compensation film 310a may be formed as the half-wave plate (HWP). The half-wave plate (HWP) has the phase difference value $\lambda/2$ of ½ of the wavelength $\lambda$ of the transmitted light. For example, when the wavelength $\lambda$ of the transmitted light is 550 nm, the first optical compensation film 310$a$ has the phase difference value in the range from 220 nm to 260 nm.

As each of the first optical compensation film 310$a$ and the second optical compensation film 315$a$ has the phase difference value varying depending on the thickness, a second thickness T6 of the second optical compensation film 315$a$ is a relatively smaller than a first thickness T5 of the first optical compensation film 310$a$. Further, the second optical compensation film 315$a$ is formed as the negative (−) A-plate and the first optical compensation film 310$a$ is formed as the positive (+) A-plate.

A method for manufacturing the display device in FIG. 10 will be illustrated with reference to drawings below.

FIG. 11A to FIG. 11H are drawings for illustrating a method for manufacturing a display device according to a third aspect.

Figure 11A:
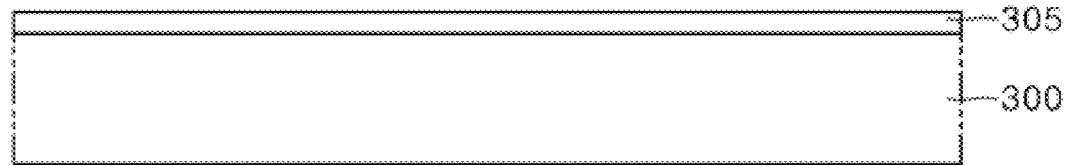
FIG. 11A to FIG. 11H are drawings for illustrating a method for manufacturing a display device according to the third aspect of the present disclosure.

Referring to FIG. 11A, an alignment material 305 is applied to a front face of a base film 300. The alignment material 305 may be formed by applying a photosensitive material having a characteristic of being aligned in one direction in response to the light. For example, the alignment material 305 may be one selected from the group consisting of the photosensitive polymer-based materials such as the polyimide (PI), the polystyrene, and the polyacrylate.

Figure 11B:
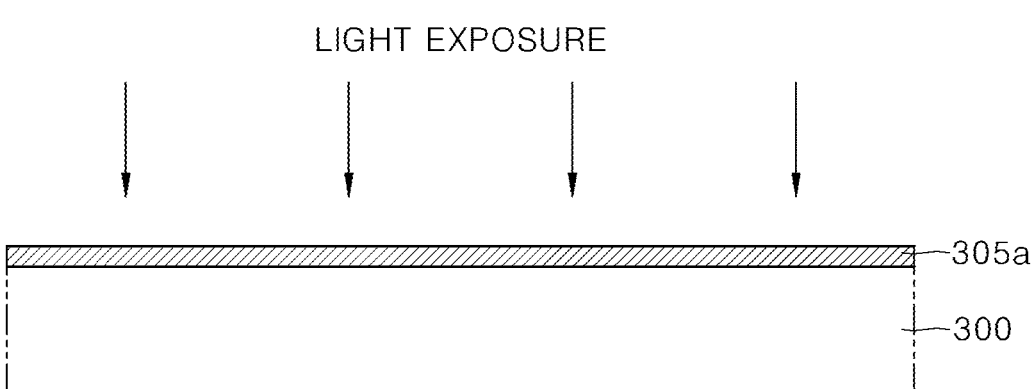

Referring to FIG. 11B, the light exposure process is performed on the alignment material 305 to form the alignment film 305$a$. The light exposure process may be performed on a plurality of disordered side-chains contained in the alignment material 305 to align the side-chains in the first direction, thereby achieving the optically aligned state of the side-chains. In this regard, the first direction may be a direction perpendicular or parallel to a surface of the base film 300.

Figure 11C:
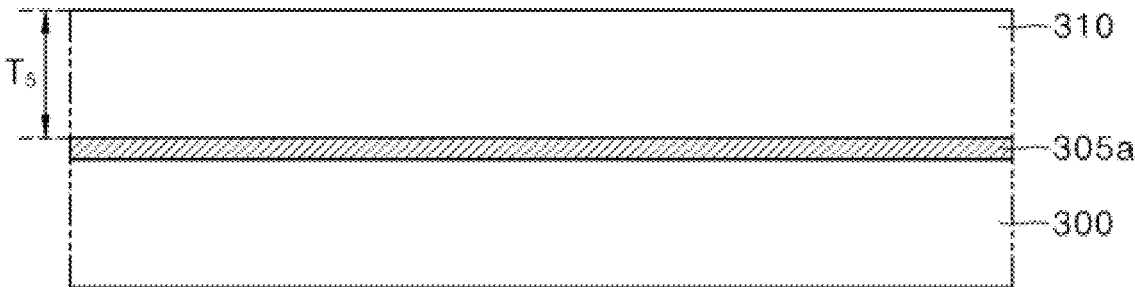

Referring to FIG. 11C, a reactive mesogenic solution 310 is applied onto the alignment film 305$a$. The reactive mesogenic solution 310 may be applied to have the third thickness T5. The reactive mesogenic solution 310 may be applied via the coating equipment by dissolving the reactive mesogenic (RM) material in the organic solvent.

Figure 11D:
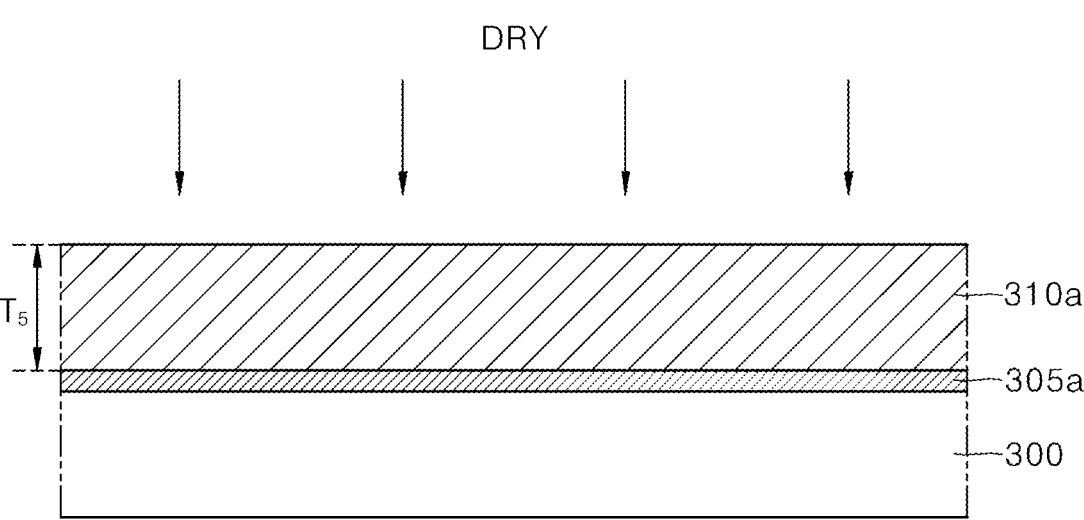

Referring to FIG. 11D, the drying process is performed on the reactive mesogenic solution 310 to form the first optical compensation film 310$a$. The drying process evaporates the organic solvent in the reactive mesogenic solution 310 to form the reactive mesogenic layer on the alignment film 305$a$ optically aligned in the first direction. The first optical compensation film 310$a$ may be formed as the half-wave plate (HWP). The half-wave plate (HWP) converts the state of light from the circularly polarized state to the linearly polarized state, and converts the state of light from the linearly polarized state to the circularly polarized state and transmits the light. The HWP has the phase difference value $\lambda/2$ of ½ of the wavelength $\lambda$ of the transmitted light.

Figure 11E:
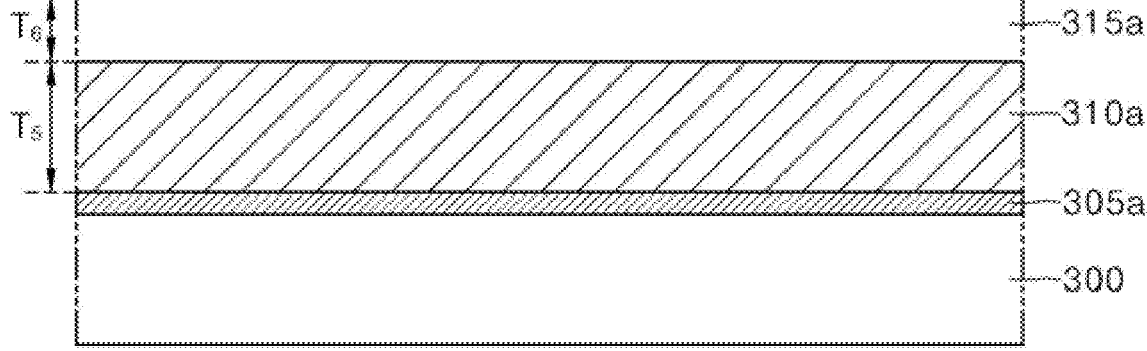

Referring to FIG. 11E, a phase difference solution 315 is applied onto the first optical compensation film 310$a$. The phase difference solution 315 may be applied to have the second thickness T6 relatively smaller than the first thickness T5 of the first optical compensation film 310$a$. The phase difference solution 315 may be applied by dissolving the polymer material that causes the cis-trans isomerization reaction, such as the azobenzene, in the organic solvent. Subsequently, the prebake process is performed on the phase difference solution 315 to evaporate the organic solvent in the phase difference solution 315.

Figure 11F:
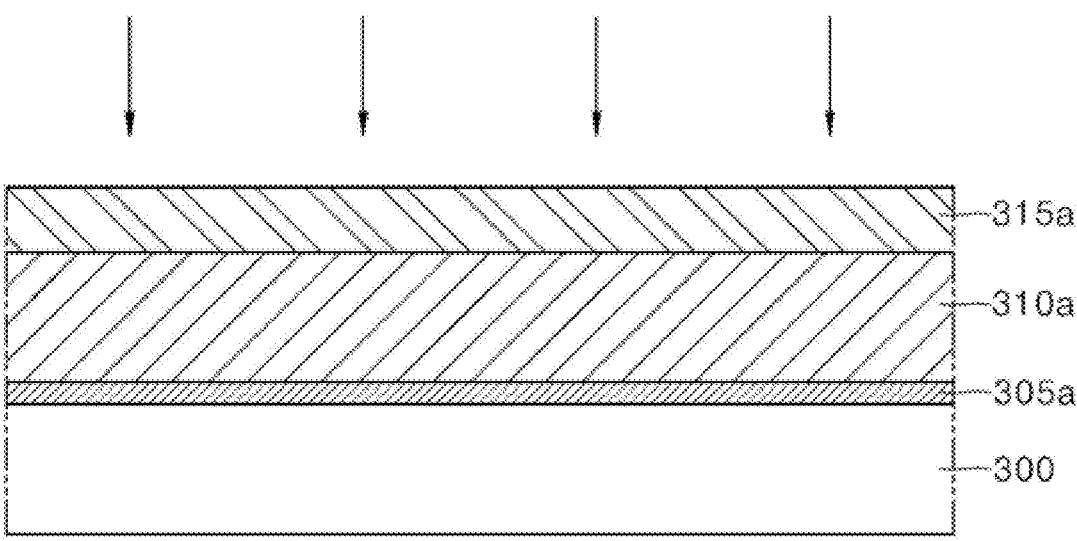

Referring to FIG. 11F, the light exposure process of irradiating the polarized ultraviolet ray and the drying process are performed on the phase difference solution 315 (see FIG. 11E) in which the organic solvent is evaporated to form the second optical compensation film 315$a$ optically aligned in the second direction. In this regard, the second direction may be a direction different from the first direction of the alignment film 305$a$. For example, when the alignment film 305$a$ is optically aligned in the vertical direction, the second optical compensation film 315$a$ may be optically aligned in the horizontal direction, and when the alignment film 305$a$ is optically aligned in the horizontal direction, the second optical compensation film 305$a$ may be optically aligned in the vertical direction.

The light exposure process irradiates the polarized ultraviolet ray. During the light exposure process, the ultraviolet ray may be irradiated at a polarized angle of 70 to 80 degrees with respect to an absorption axis of a polarizing layer to be formed later with a wavelength in a range from 200 nm to 400 nm. The ultraviolet ray has an angle of 60 degrees with respect to an optical axis of the first optical compensation film 315$a$.

When the polarized ultraviolet ray is irradiated onto the phase difference solution containing the polymer material including the azobenzene, as described in FIG. 9, the isomerization phenomenon in which one isomer is changed to another isomer as the molecule rotates occurs. In addition, while the isomerization phenomenon ends in the state in which the molecule is rotated at the angle $\beta$ of 90 degrees with respect to the irradiated direction of the polarized ultraviolet ray, the refractive index anisotropy occurs. That is, a state in which the polarized ultraviolet ray has a phase difference in a direction perpendicular to the irradiated direction of the polarized ultraviolet ray. The second optical compensation film 315$a$ is formed by performing the drying process for fixing the alignment in which the refractive index anisotropy is generated.

The second optical compensation film 315$a$ may be formed as the quarter-wave plate (QWP). The quarter-wave plate (QWP) converts the state of light from the circularly polarized state to the linearly polarized state, and converts the state of light from the linearly polarized state to the circularly polarized state and transmits the light. The QWP has the phase difference value $\lambda4$ of ¼ of the wavelength $\lambda$ of the transmitted light. For example, when the wavelength $\lambda$ of the transmitted light is 550 nm, the second optical compensation film 315$a$ has the phase difference value in the range from 110 nm to 130 nm.

Each of the first optical compensation film 310$a$ and the second optical compensation film 315$a$ has the phase difference value varying depending on the refractive index and the thickness thereof. As the first optical compensation film 310$a$ according to an aspect of the present disclosure is formed as the half-wave plate (HWP) and the second optical compensation film 315$a$ is formed as the quarter-wave plate (QWP), the third thickness T5 of the first optical compensation film 310$a$ is relatively greater than the fourth thickness T6 of the second optical compensation film 315$a$.

Figure 11G:
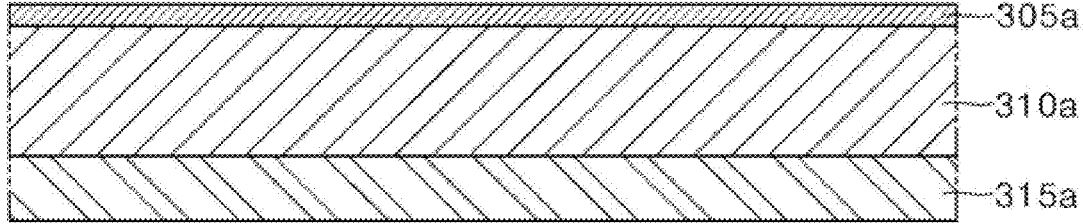

Referring to FIG. 11G, in the structure in which the alignment film 305$a$, the first optical compensation film 310$a$, and the second optical compensation film 315$a$ are stacked, the base film 300 (see FIG. 11F) is peeled from the alignment film 305$a$. Subsequently, the structure is inverted such that an exposed face of the alignment film 305$a$ is at a top of the structure and an exposed face of the second optical compensation film 315$a$ is at a bottom of the structure. Then, the second optical compensation film 315$a$ is located at the lowermost portion of the structure and the alignment film 305*a* is located at the uppermost portion of the structure.

Figure 11H:
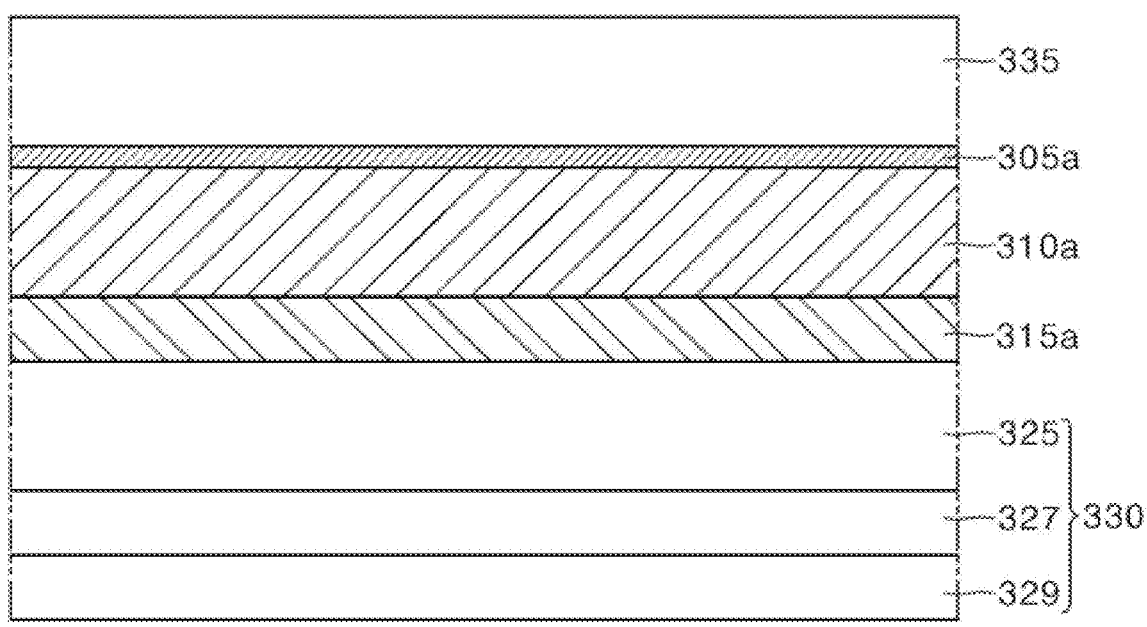

Referring to FIG. 11H, the phase difference film including the first optical compensation film 310*a* and the second optical compensation film 315*a* is disposed on an array substrate 330. The array substrate 330 may be composed of a substrate 325, and an array 327 and a protective film 329 disposed on one surface (or a bottom side) of the substrate 325. The substrate 325 may contain a display substrate (not shown) made of the polymer or the plastic such as the polyimide (PI) or the glass.

The array 327 may include the circuit including the driving thin-film transistor, the storage capacitor, and the like, and the plurality of pixels formed with the organic light-emitting element. The pixel is composed of the conductive layer and the organic material layer for emitting the light of the various colors to the outside. For example, the pixel may include the organic light-emitting element composed of the pixel electrode, the organic light-emitting layer, and the common electrode. The light may be emitted from the organic light-emitting element.

The array 327 may be sealed by the protective film 329 made of the insulating material. The protective film 329 may be composed of the inorganic insulating layer or the organic insulating layer, or may have the multi-layer structure thereof to prevent the external moisture, oxygen, or impurities from penetrating into the organic light-emitting diode and degrading the performance thereof.

The structure in which the second optical compensation film 315*a*, the first optical compensation film 310*a*, and the alignment film 305*a* are sequentially stacked may be disposed on the other surface opposite to one face of the substrate 325 on which the array 327 and the protective film 329 are disposed, for example, the upper side of the substrate 325.

In addition, the polarizing layer 335 is formed on the alignment film 305*a*. The polarizing layer 335 changes the polarizing characteristics of the incident light. In one example, the polarizing layer 335 may contain the polyvinyl alcohol (PVA).

According to an aspect of the present disclosure, as the optical compensation films are introduced as the positive (+) A-plate and the negative (−) A-plate between the substrate and the polarizing layer, the optical path is formed such that the direction of the light reflected from the display device is adjacent to or coincident with the direction of the absorption axis of the polarizing layer, so that the defect such as the light leakage or the color inversion may be prevented or minimized. Further, as the optical compensation films are formed as the positive (+) A-plate and the negative (−) A-plate, the refractive indices of the light have almost the same value, so that the optical compensation may be made while not being affected by the refractive index, thereby reducing the light leakage phenomenon even at the viewing angle.

Further, according to aspects of the present disclosure, the excellent image quality may be realized as the accuracy of representing the color to be realized increases also at the viewing angle because the color change resulted from the change in the viewing angle is small. Further, the manufacturing process may be simplified as the optical compensation films having the different phase difference values and optical properties are formed via the continuous manufacturing process. Accordingly, the reliability of the display device may be improved by preventing the defect that occurs when the two sheets of optical compensation films are separately manufactured and bonded to each other.

A scope of protection of the present disclosure should be construed by the scope of the claims, and all technical ideas within the scope equivalent thereto should be construed as being included in the scope of the present disclosure. Although the aspects of the present disclosure have been described in more detail with reference to the accompanying drawings, the present disclosure is not necessarily limited to these aspects. The present disclosure may be implemented in various modified manners within the scope not departing from the technical idea of the present disclosure. Accordingly, the aspects disclosed in the present disclosure are not intended to limit the technical idea of the present disclosure, but to describe the present disclosure. The scope of the technical idea of the present disclosure is not limited by the aspects. Therefore, it should be understood that the aspects as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display device comprising:
a substrate;
an alignment film positioned on the substrate;
an optical compensation film positioned on the alignment film and including a first optical compensation film disposed on the alignment film and a second optical compensation film disposed on the first optical compensation film; and
a polarizing layer disposed on the second optical compensation film,
wherein the first optical compensation film has a phase difference value of $\lambda/4$ of a wavelength of transmitted light and the second optical compensation film has a phase difference value of $\lambda/2$ of the wavelength of the transmitted light,
wherein the first optical compensation film is formed as a positive (+) A-plate having a refractive index characteristic of nx=nz<ny, and the second optical compensation film is formed as a negative (−) A-plate having a refractive index characteristic of nx=nz>ny, such that an overall refractive index characteristic of the optical compensation film is nx≈ny≈nz.

2. The display device of claim 1, wherein the first optical compensation film is in contact with the alignment film, and the second optical compensation film is in contact with the first optical compensation film.

3. The display device of claim 1, wherein the first optical compensation film has a first thickness and the second optical compensation film has a second thickness that is greater than the first thickness of the first optical compensation film.

4. The display device of claim 1, wherein the first optical compensation film includes a positive (+) A-plate and the second optical compensation film includes a negative (−) A-plate.

5. The display device of claim 1, wherein the second optical compensation film includes a polymer material.

6. The display device of claim 5, wherein the polymer material is azobenzene that causes a cis-trans isomerization reaction.

7. A display device comprising:
a substrate;
a polarizing layer positioned on the substrate;
an alignment film positioned beneath the polarizing layer; and an optical compensation film positioned between the substrate and the alignment film, wherein the optical compensation film includes a first optical compensation film having a phase difference value of $\lambda/2$ of a wavelength of transmitted light and a second optical compensation film having a phase difference value of $\lambda/4$ of the wavelength of the transmitted light, wherein the first optical compensation film disposed on the alignment film and the second optical compensation film disposed on the first optical compensation film, and wherein the first optical compensation film is formed as a positive (+) A-plate having a refractive index characteristic of nx=nz<ny, and the second optical compensation film is formed as a negative (−) A-plate having a refractive index characteristic of nx=nz>ny, such that an overall refractive index characteristic of the optical compensation film is nx≈ny≈nz.

8. The display device of claim 7, wherein the first optical compensation film is in contact with the alignment film, and the second optical compensation film is in contact with the first optical compensation film.

9. The display device of claim 7, wherein the first optical compensation film has a first thickness and the second optical compensation film has a second thickness relatively smaller than the first thickness of the first optical compensation film.

10. The display device of claim 7, wherein the first optical compensation film is formed as a positive (+) A-plate and the second optical compensation film is formed as a negative (−) A-plate.

11. The display device of claim 7, wherein the second optical compensation film includes a polymer material.

12. The display device of claim 7, wherein the polymer material is azobenzene that causes a cis-trans isomerization reaction.

13. A method for manufacturing a display device, the method comprising:

forming an alignment film optically aligned in a first direction;

forming a first optical compensation film on the alignment film;

applying a phase difference solution onto the first optical compensation film;

irradiating polarized ultraviolet ray onto the phase difference solution to form a second optical compensation film optically aligned in a second direction different from the first direction;

disposing an optical compensation film including the alignment film, the first optical compensation film, and the second optical compensation film on a substrate; and forming a polarizing layer on the optical compensation film, wherein the first optical compensation film is formed as a positive (+) A-plate having a refractive index characteristic of nx=nz<ny, and the second optical compensation film is formed as a negative (−) A-plate having a refractive index characteristic of nx=nz>ny, such that an overall refractive index characteristic of the optical compensation film is nx≈ny≈nz.

14. The method of claim 13, wherein the first optical compensation film includes a quarter-wave plate and the second optical compensation film includes a half-wave plate.

15. The method of claim 13, wherein the first optical compensation film includes a half-wave plate and the second optical compensation film includes a quarter-wave plate.

16. The method of claim 13, wherein the phase difference solution contains a polymer material optically aligned in the second direction by the irradiation of the polarized ultraviolet ray.

17. The method of claim 16, wherein the polymer material includes azobenzene that causing a cis-trans isomerization reaction.

18. The method of claim 13, wherein the disposing the optical compensation film includes disposing the optical compensation film on the substrate such that the alignment film is in contact with the substrate and the second optical compensation film is in contact with the polarizing layer.

19. The method of claim 13, wherein the disposing the optical compensation film includes disposing the optical compensation film on the substrate such that the second optical compensation film is in contact with the substrate and the alignment film is in contact with the polarizing layer.

* * * * *